AUTOMATIC FREQUENCY CONTROL

Filed Feb. 5, 1952

INVENTORS
George Murray
Thomas Brown Watkins
BY
ATTORNEY

April 9, 1957 | G. MURRAY ET AL | 2,788,445

AUTOMATIC FREQUENCY CONTROL

Filed Feb. 5, 1952 | 3 Sheets-Sheet 2

INVENTORS
GEORGE MURRAY
THOMAS BROWN WATKINS
BY [signature]
ATTORNEY

INVENTORS
George Murray
Thomas Brown Watkins
BY [signature]
ATTORNEY

United States Patent Office 2,788,445

Patented Apr. 9, 1957

2,788,445

AUTOMATIC FREQUENCY CONTROL

George Murray, Ealing Common, London, and Thomas Brown Watkins, London, England, assignors to The General Electric Company Limited, London, England Application February 5, 1952, Serial No. 270,052

Claims priority, application Great Britain October 13, 1950

8 Claims. (Cl. 250—36)

The present invention relates to electrical oscillation generators. More particularly the invention is concerned with generators which are adapted to generate electrical oscillations of very high frequencies which, in this specification, will be considered to be frequencies greater than 300 megacycles per second. Such generators are used, for example, in microwave radio transmitters and receivers.

One object of the present invention is to provide a very high frequency electrical oscillation generator having simple means for automatically controlling the frequency thereof.

According to the present invention, an oscillation generator adapted to generate electrical oscillations of very high frequency comprises electrical means which is adapted to generate electrical oscillations of very high frequency which are frequency modulated at a lower frequency, detector means, a band-pass filter having a relatively narrow band width through which at least part of the frequency modulated oscillations supplied by said means is arranged to be fed to the detector means, an amplifier which is arranged to be supplied from the detector means and is adapted to pass a signal containing the fundamental frequency of said frequency modulation and a side band frequency or range of frequencies and which is provided with automatic gain control, and tuning means to tune the said electrical means in dependence upon the fundamental modulation frequency component passed by the amplifier so that, during operation of the generator, the mean frequency of the oscillations supplied by said electrical means to said band-pass filter is substantially equal to the mid-frequency of the pass band of said filter and the amplifier passes a signal which effects gain control thereof even when the electrical means is so tuned.

Preferably the band-pass filter is a resonant cavity.

The said electrical means may be adapted to frequency modulate a sinusoidal signal on to the very high frequency oscillations. Alternatively the modulation signal may be a pulse signal in which pulses occur in regular recurrent intervals and in this case, if the signal is of the type transmitted in a pulse code signalling system, not all the intervals need contain pulses.

The said means for producing the very high frequency oscillations may be an oscillator but need not be a simple source, for example it may comprise two oscillators, one of which is frequency modulated, and mixing means to derive from the oscillations supplied by these oscillators the required very high frequency oscillations having the sum or difference frequency of the separate oscillations.

Figure 4:
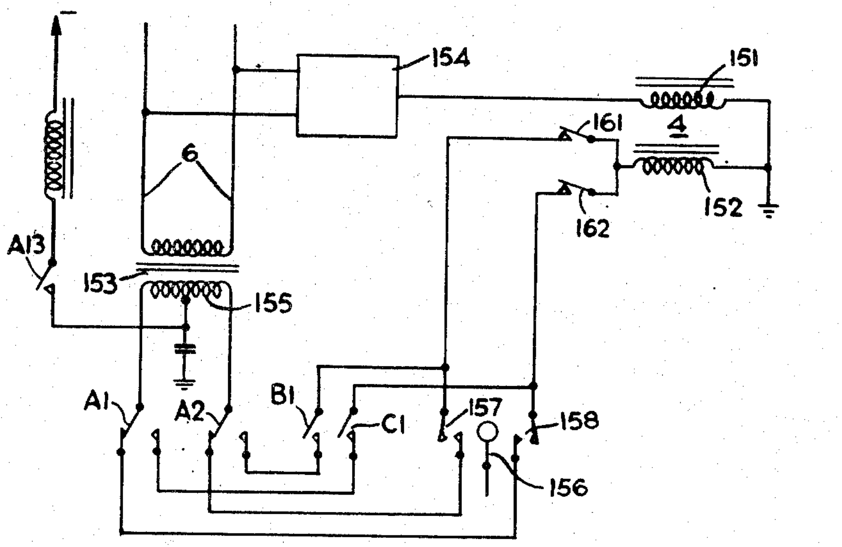
Figure 2:
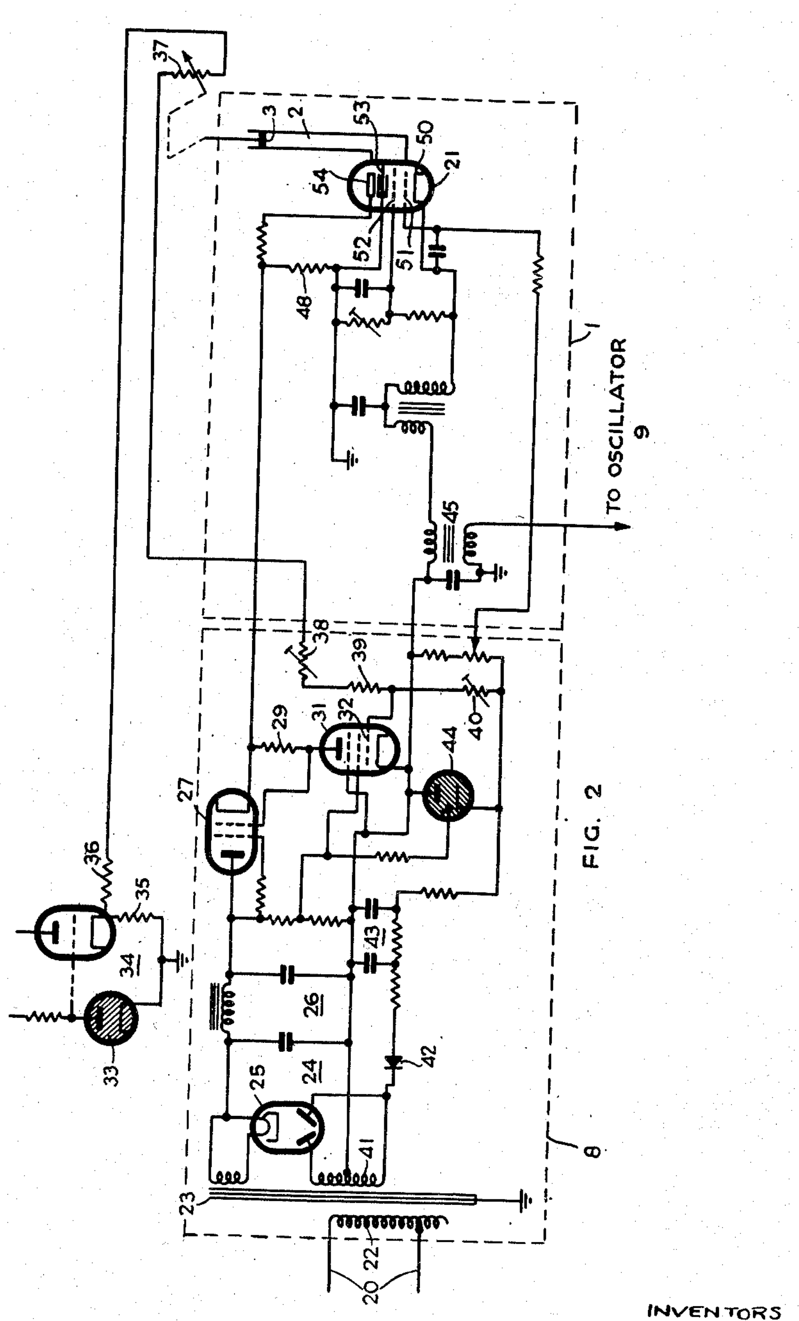
Figure 3:
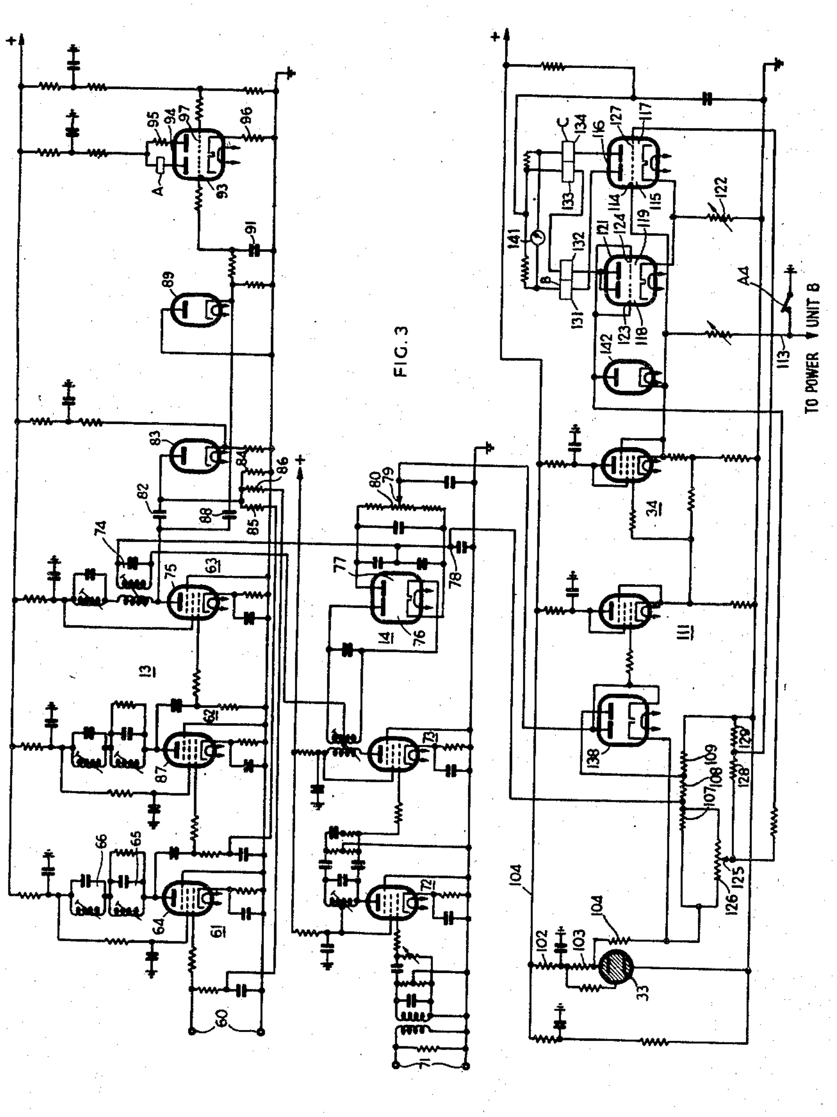

One arrangement of an oscillation generator according to the present invention and which is adapted to operate at frequencies of the order of 4,500 megacycles per second will now be described by way of example with reference to the four figures of the accompanying drawings. In the drawings, Figure 1 shows a block diagram of the complete oscillation generator, Figure 2 shows the circuit diagram of the oscillator which is adapted to operate at the required output frequency together with its associated apparatus including a stabilised power unit, Figure 3 shows the circuit diagram of an amplifier and its associated apparatus in the frequency control circuit of the said oscillator, and Figure 4 shows the circuit of an electric motor and its associated relays which is arranged to effect mechanical tuning of the said oscillator.

Figure 1:
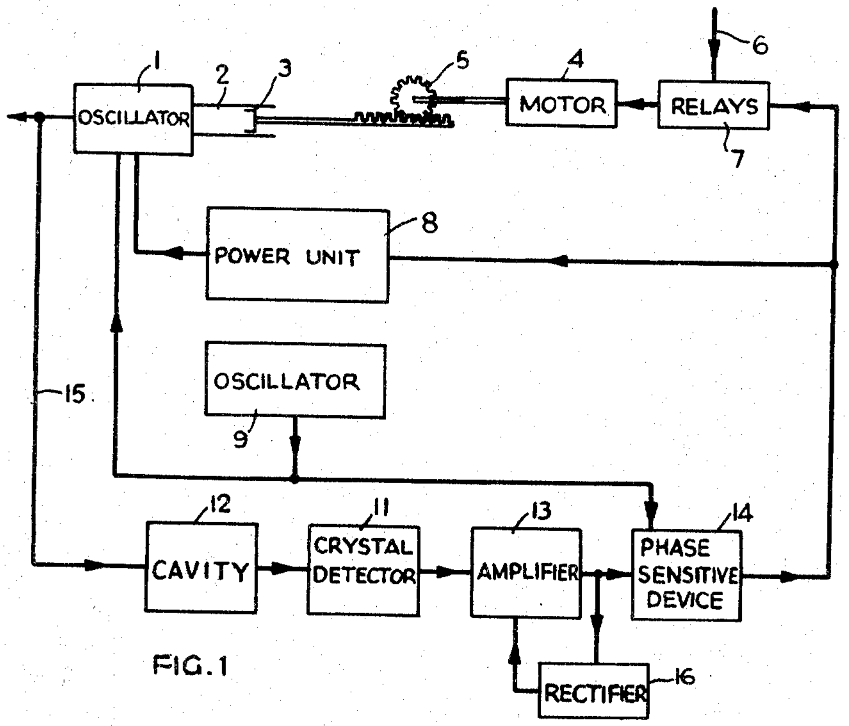

Referring now to Figure 1 of the drawings, the oscillator 1 is adapted to operate at frequencies in the region of 4,500 megacycles per second. The operating frequency of this oscillator 1 is determined primarily by a resonant cavity 2 which has a plunger 3 at one end thereof, the plunger 3 being arranged to be moved in the cavity 2 by means of an electric motor 4 through a rack and pinion mechanism 5. Alternating current is supplied over the path 6 to the motor 4 under the control of relays 7. The necessary power supplies for the oscillator 1 are obtained from the power unit 8 and small variations in the frequency of the oscillator 1 may be obtained by varying the output of the power unit 8.

Oscillations having a frequency of 420 kilocycles per second are supplied by the oscillator 9 and are used to frequency modulate the oscillator 1 so that the very high frequency oscillations supplied by the oscillator 1 are frequency modulated at that lower frequency. A portion of the output of the oscillator 1 is fed to a crystal detector 11 through a cavity 12 which acts, in effect, as a band pass filter. This cavity 12 has a single hump attenuation/frequency characteristic and has a relatively narrow band pass which is centred about the desired mean frequency of the oscillations supplied by the oscillator 1. It will be appreciated that the modulation frequency signal supplied by the detector 11 is a measure of the slope of the cavity characteristic at the mean frequency of the oscillations supplied thereto and if the desired frequency and the mean frequency coincide there is no such output from the detector 11 whereas there is such output when these frequencies differ, the phase of the output signal being 180° different when the mean frequency is on alternate sides of the cavity frequency. When, however, the mean frequency of the oscillations supplied to the cavity 12 equals the frequency to which the cavity is tuned, due to the modulation sending the operating frequency a short distance down the said characteristic on both sides of the resonant frequency during each cycle of modulation, there is an output signal from the detector 11 at the second harmonic of the modulation frequency.

The output signal from the detector 11 is passed through an amplifier 13 and the fundamental modulation component is compared by a phase sensitive device 14 with the oscillations supplied by the oscillator 9. This device 14 is arranged to produce no signal when these oscillations are in phase and unidirectional signals of opposite sense when the phase of the modulation component is leading or lagging on the oscillations supplied by the oscillator 9. The output signal from the phase sensitive device 14 is fed to the relays 7 and power unit 8 so as to effect coarse and fine control respectively of the operating frequency of the oscillator 1.

It will be appreciated that there is a closed loop servo system for frequency control of the oscillator 1 and in the particular arrangement being described there is a loop gain of the order of twenty. It is necessary for this loop gain to remain substantially constant since if it varies so as appreciably to increase the gain, instability may occur. In this arrangement, however, the oscillator 1 is located a distance from the cavity 12, a suitable length of coaxial cable, for example 100 feet, being used to provide the path 15 between the oscillator 1 and cavity 12. Thus, the oscillator 1 may be the local oscillator of a radio receiver and in view of the very high frequencies with which this receiver is concerned the oscillator 1 may be located close to the aerial system at the top of a tower while the remaining frequency control equipment may be at the bottom of the tower. With such a cable between the oscillator 1 and cavity 12, it is found that the cable introduces a variable attenuation into the control loop, the actual value depending largely on climatic conditions. It is desirable, therefore, to provide some automatic gain control and for this purpose a portion of the output of the amplifier 13 is fed to a rectifier 16, the rectified output being fed back to the amplifier 13 to control the gain thereof.

It will be appreciated that if the amplifier 13 was arranged only to pass oscillations having the frequency of those supplied by the oscillator 9 it would not be possible to control the gain of the amplifier 13 in this manner since, as previously discussed, the output of the amplifier 13 would be zero when the oscillator 1 was correctly tuned so that the amplifier 13 would then have maximum gain. By arranging for the amplifier 13 to pass both the fundamental and the second harmonic of the modulation oscillations there is a signal passed by the rectifier 16 when the oscillator 1 is on frequency so that the gain of the amplifier 13 is reduced to the desired value.

Referring now to Figure 2 which shows the oscillator 1 and power unit 8 in more detail, the oscillator 1 comprises a valve 21 of the velocity modulated type and the electrodes of this valve consist of a cathode 50, a first grid 51 the potential of which determines the electron current through the valve, a screen grid 52, a grid 53 and an anode 54. The grid 53 is arranged in the form of a co-axial line which is short-circuited at one end so that the inner and outer conductors are at the same direct current potential (they are in fact earthed) and these two conductors are slotted so that before reaching the anode 54 the electron beam in the valve passes through a slot in one side of the outer conductor, then through a slot in the inner conductor and finally through a slot in the other side of the outer conductor. Focussing of the electron beam is effected by means of a magnet (not shown) and the said inner conductor of the line which forms the grid 53 is extended to form a probe into the cavity 2.

In the power unit 8 a primary winding 22 of the transformer 23 is connected to an alternating current supply 20. The transformer 23 supplies a full wave rectifier 24 which comprises a double diode valve 25. The output from the rectifier 24 is smoothed by means of the network 26 and a valve 27, the voltage supplied to the control grid 28 of this valve being determined by the voltage drop across a resistor 29 which is connected in series with a pentode valve 31 across the smoothed supply. The voltage fed to the control grid 32 of the valve 31 is determined primarily by the voltage across a gas-filled stabiliser tube 33. In fact, the voltage across the tube 33 is fed together with a frequency correcting signal, as hereinafter described, to a cathode follower stage 34, the voltage developed across the cathode load resistor 35 being supplied to the potentiometer formed by the resistors 36, 37, 38, 39 and 40 and the grid 32 being connected to the junctions of the resistors 39 and 40.

The voltage across half the secondary winding 41 of the transformer 23 is also rectified by means of a rectifier 42 and the resulting direct current is smoothed by means of the network 43 and is stabilised by the voltage stabilising tube 44. This stabilised voltage developed across the tube 44 is used to provide the bias on the grid 51 relative to the cathode 50 of the valve 21 and the output from the oscillator 9 is modulated on to this supply by means of the transformer 45 so as to effect the desired frequency modulation of the oscillator 1.

The operating frequency of the oscillator 1 may be adjusted by varying the voltage on the anode 54 and grid 53 of the valve 21 relative to the cathode 50, the resistor 48 ensuring that there is a desired voltage difference between the voltage on these two electrodes 53 and 54. This frequency control is carried out by varying the voltage developed across the resistor 35 so as to vary the voltage supplied to the grid 32 of the valve 31 and thus the voltage supplied to the anode 46 and screen 47 of the valve 21. As previously mentioned the oscillator 1 may also be tuned by moving a plunger 3 in a cavity 2. In order to obtain maximum power from the oscillator 1 it is however necessary for the operating voltage of the anode 54 and screen 53 to be varied with frequency. For this purpose the resistor 37 is variable and is mechanically coupled to the plunger 3 and since the relation between the plunger position and optimum voltage is approximately linear the resistor 37 may follow a linear law. The present resistors 38 and 40 are adjusted so as to give the required supply voltage to the valve 21 for maximum power at the two ends of the frequency range of the oscillator 1.

The cavity 12 is a right cylindrical cavity which is arranged to be excited in the $H_{011}$ mode and tuning is effected by a plunger which forms one end of the cavity. The position of the plunger is varied by means of a micrometer head so that the required frequency of operation of the oscillator 1 may be varied. Coupling to the cavity is by means of two loops with their planes at right angles to the cavity axis and these two loops are mutually at right angles to one another so as to minimise pick up of unwanted modes.

Referring now to Figure 3 which shows the amplifier 13 and a phase sensitive device 14 in more detail the signal supplied by the crystal detector 11 is fed across terminals 60. This signal is fed through three amplifier stages 61, 62 and 63 which are connected in cascade and the anode load in each of these stages is formed by a pair of parallel resonant circuits. Thus, considering the amplifier stage 61 for example, there is provided in the anode circuit of the valve 64 a pair of resonant circuits 65 and 66. These circuits 65 and 66 are tuned to 420 and 840 kilocycles per second respectively, that is to say, the fundamental and second harmonic of the oscillations supplied by the oscillator 9.

A portion of the output of the oscillation 9 is also fed across a pair of terminals 71 and the signal developed across the terminal 71 is fed through amplifier stages 72 and 73 to the phase sensitive device 14 to which is also supplied oscillations having the same frequency from the amplifier stage 63. These last mentioned oscillations are developed across a parallel resonant circuit 74 which is tuned to 420 kilocycles and is coupled into the anode circuit of the valve 74. The phase sensitive device 14 is formed by a pair of diode valves 76 and 77 and the output from the device 14 is taken from the point 78 and the tapping point 79 and the potentiometer 80.

In addition, a portion of the signal developed across the whole anode load of the valve 75 is fed through a condenser 82 to a diode valve 83 so that a voltage developed across the resistor 84 is a measure of the signal being passed through the amplifier 13. The voltage developed across the resistor 84 is fed to the valves 87 and 64 respectively so as to vary the gain of the stages 61 and 62 thus ensuring the required control of the gain in the servo loop controlling the frequency of the oscillator 1.

A portion of the signal developed across the anode load of the valve 75 is also fed through a condenser 88 and is rectified by means of the diode valve 89. The resulting direct current voltage developed across the condenser 91 is fed to the control grid 93 of one half of the double triode valve 94. A relay A is provided in the anode circuit of that half of the valve 94 while a resistor 95 is connected in the anode circuit of the other half of the valve 94, the grid 97 of which is maintained at a fixed voltage. The resistor 96 is common to the cathode circuit of both halves of the valve 94. Thus, when a signal of sufficient amplitude is passed by the amplifier 13, the voltage developed across the condenser 91 causes the voltage on the grid 93 to rise so as to increase the anode current in that half of the valve 94 and effect operation of the relay A, the relay A being unoperated when there is no such signal through the amplifier 13.

The gas-filled stabiliser tube 33 (previously mentioned with reference to Figure 2) is connected in series with resistors 102 and 103 between a positive supply line 104 and earth. The stabilised voltage across the tube 101 is fed to the potentiometer network formed by the resistors 107, 108 and 109. The output from the phase sensitive device 14 is added to the voltage at the junction of the resistors 107 and 108 with respect to earth and then fed to a cathode follower stage 111. The output from the cathode follower stage 111 is fed through a switch 112 to the further cathode follower stage 34 (also previously mentioned with reference to Figure 2).

The signal passed by the cathode follower stage 34 is utilised to effect frequency control of the oscillator 1 as hereinbefore described with reference to Figure 2. Thus a voltage is fed over a path 113 to the power unit 8 and this voltage is required to be a predetermined value when the oscillator 1 is tuned to a frequency of the cavity 12 and to vary on either side of that value for fine control of the frequency of the oscillator 1 over a range of say half a megacycle. The double diode valve 138 is arranged to limit the voltage swing that can be fed to the cathode follower stage 111 to approximately plus or minus five volts since the change in the operating voltages of the valve 21 which might occur if the valve 138 was omitted would appreciably reduce the power output of the oscillator 1.

For larger changes in frequency of the oscillator 1 it is necessary, as hereinbefore mentioned, to re-tune the cavity 2. For this purpose the signal passed by the cathode follower stage 34 is also fed to the grid 114 of a triode valve 115 which forms half of a double triode valve 116. The two triode valves 115 and 117 together with the two triode valves 118 and 119 which are formed by a double triode valve 121 have a common cathode resistor 122. The control grids 123 and 124 of the triodes 118 and 119 respectively are fed with a voltage supplied by the tapping point 125 of a potentiometer 126 which is connected across the resistor 107. The control grid of the triode 117 is similarly supplied from the junction of a pair of resistors 128 and 129 which form a potentiometer across which is the voltage fed to the grids 123 and 124. Two differential electro-magnetic relays B and C each having a pair of windings 131, 132 and 133, 134 are connected in the anode circuits of the valves 115, 117, 118 and 119. Thus the combined anode currents of the valves 118 and 119 flows through both the operating winding 132 of the relay B and the winding 133 of the relay C while the anode current of the valve 115 passes through the winding 131 of the relay B and the anode current of the valve 117 passes through the winding 134 of the relay C.

The relays B and C are arranged in similar manner, the windings 131 and 132 of the relay B for example, being connected so that the currents flowing through them are in opposition. The windings 131 and 132 have a turns ratio approximately two to one. When there is no output from the phase sensitive device 14, it is required that the four valves 115, 117, 118 and 119 shall all pass the same anode current and it will be realised that under those conditions relays B and C are both unoperated. This is effected by adjusting the tapping point 125 of the potentiometer 126 so that there is zero reading of the meter 141 when there is no output from the phase sensitive device 14.

During operation of this relay arrangement, when the tapping point 79 of the phase sensitive device 14 is positive relative to the point 78, the grid 114 of the valve 115 is held more positive than when there is no output from the device 14 and a diode valve 142 is non-conducting and thus of no effect. When the output of the device 14 is sufficiently great in this sense, a relatively large current flows through the winding 131 while a reduced current flows through the other windings 132, 133, and 134 so that the relay B is operated. Similarly, when the output of the device 14 is of the opposite sense so that the diode 142 is caused to be conducting, the relay C is operated when the output is sufficiently great. The voltage supplied to the grid 127 is slightly less than that supplied to the grids 123 and 124 so as to compensate for the "contact potential" of the diode 142 and thereby ensure that the relays B and C are operated with control voltages of the same magnitude from the device 14.

Referring now to Figure 4 of the drawings which shows the arrangement of the contacts of the relays A, B and C over which current is supplied to the rotor windings 151 and 152 of the two-phase alternating current motor 4 which drives the rack and pinion 5 through a reduction gear train (not shown). Thus, alternating current having a frequency of 50 cycles per second is supplied over the path 6 and fed through a transformer 153 to give a 45–0–45 volt output. The winding 151 is continuously supplied with alternating current having a fixed phase, this current being derived through the network 154 while the winding 152 is arranged to be connected to either one side or the other of the secondary winding 155 of the transformer 153 so that the current through the winding 152 is either leading or lagging the current through the winding 151 by 90 electrical degrees. The network 154 may merely be a transformer having one side of its secondary winding earthed.

When the oscillator 1 is first being tuned after switching on, there will be no signal passed by the amplifier 13 so that the relay A will be unoperated and the contact A1 and A2 will be in the position shown in Figure 4 so that the winding 152 may be energised to cause the motor 4 to rotate in either direction by moving a key switch 156 either to left or to right so as to close the contacts 157 or 158. When the oscillator 1 is tuned sufficiently close to the frequency of the cavity 12 for a signal to be passed by the amplifier 13, the relay 8 is operated and the winding 152 may then be energised through either the contacts B1 or C1 depending upon which relay B or C is operated to effect frequency control of the oscillator 1 as hereinbefore described.

Limit switches 161 and 162 are provided to ensure that the plunger 3 is only moved over a predetermined distance. In addition to the alternating current through the winding 152 a direct current is also supplied over contacts A3. This direct current is of the same order of magnitude as the alternating current and has the effect of approximately halving the speed of the motor 4.

Until such time as a signal is being passed through the amplifier 13 in the frequency control loop it is clearly undesirable for any frequency control signal to be supplied over the path 113 (Figure 3). This is ensured by the contacts A4 which connect the path 113 to earth until the relay A is operated.

The oscillation generator described above may be modified for use in the transmitting station of a pulse code modulation signalling system. In that case instead of using the sinusoidal signal supplied by the oscillator 9 to frequency modulate the oscillator 1, the pulse code signal itself may be used to effect the frequency modulation.

In such a system, pulses occur in periodically recurrent intervals of time and although the distribution of pulses in these intervals is irregular the modulation signal nevertheless contains a component having the pulse recurrence frequency provided that the pulse length is not too long.

If, however, a pulse code signal is used to modulate the output of the oscillator 1 and the pulse recurrence frequency is 420 kilocycles per second while each pulse has a length of $\frac{1}{420}$ milli-seconds, it will be realised that if two or more pulses occur in adjacent intervals there will be no 420 kilocycles per second component of the modulation signal. In this case a sinusoidal signal having a slightly different frequency, say 390 kilocycles per second, and a relatively small amplitude, say 10% of the pulse signal, may be superimposed on to the pulse code signal. The amplifier 13 would then be tuned to 390 kilocycles per second and, although no second harmonic of that frequency would be present, automatic gain control of the amplifier 13 may be effected by utilising side-band components over a range of frequencies that are contained in the pulse code signal and are passed by that amplifier. This sinusoidal signal may be continuously superimposed on the pulse code signal but alternatively if, say, the pulse code signal is of the binary type having two levels, the sinusoidal signal may be superimposed on only one of those levels.

We claim:

1. An oscillation generator adapted to generate electrical oscillations of very high frequency comprising electrical means which is adapted to generate electrical oscillations of a very high frequency which are frequency modulated, detector means, a band-pass filter having a relatively narrow band width through which at least part of the frequency modulated oscillations supplied by said electrical means is arranged to be fed to the detector means, an amplifier which is arranged to be supplied from the detector means and is adapted to pass a signal containing the fundamental frequency component of said frequency modulation and a side-band frequency component, means to control the gain of the amplifier in dependence upon the amplitude of signal passed thereby, whereby in the absence of the fundamental frequency modulated component the gain of the amplifier is controlled by the side-band frequency component in order to maintain the gain of the amplifier substantially constant, and tuning means to tune the said electrical means in dependence upon the fundamental modulation frequency component passed by the amplifier so that, during operation of the generator, the mean frequency of the oscillations supplied by said electrical means to said band-pass filter is substantially equal to the mid-frequency of the pass band of said filter and the amplifier passes a signal which effects gain control thereof even when the electrical means is so tuned.

2. An oscillation generator according to claim 1 wherein the said band-pass filter is a resonant cavity.

3. An oscillation generator according to claim 1 wherein the output from the said electrical means consists of very high frequency oscillations which are frequency modulated by a sinusoidal signal having a lower frequency.

4. An oscillation generator adapted to generate electrical oscillations of very high frequency comprising electrical means which is adapted to generate electrical oscillations of very high frequency, means to frequency modulate the very high frequency oscillations with a sinusoidal modulation signal having a lower frequency, detector means, a resonant cavity through which part of the frequency modulated oscillations supplied by said electrical means is arranged to be fed to the detector means, an amplifier which is arranged to be supplied from the detector means and is adapted to pass a signal containing both the fundamental frequency component and a side-band frequency component constituting the second harmonic of said frequency modulation, means to control the gain of the amplifier in dependence upon the amplitude of signal passed thereby, whereby in the absence of the fundamental frequency modulated component the gain of the amplifier is controlled by the side-band frequency component in order to maintain the gain of the amplifier substantially constant, and tuning means to tune the said electrical means in dependence upon the fundamental modulation frequency component passed by the amplifier so that, during operation of the generator, the mean frequency of the oscillations supplied by said electrical means to said resonant cavity is substantially equal to the mid-frequency of the pass band of said cavity and the amplifier passes a signal which effects gain control thereof even when the electrical means is so tuned.

5. An oscillation generator according to claim 4 wherein the said electrical means is an oscillator.

6. An oscillation generator according to claim 5 wherein the said oscillator is of the velocity-modulated type and the said tuning means comprises means to effect course tuning of the oscillator by movement of a plunger in a resonant cavity and means to effect fine tuning by varying an electrical signal supplied to the oscillator, the means to effect both coarse and fine tuning being controlled in dependence upon the fundamental modulation frequency component of the signal passed by said amplifier.

7. An oscillation generator comprising a first oscillator for generating oscillations of very high frequency and which is adapted to be frequency modulated, a second oscillator to generate oscillations of a lower reference frequency, a path for supplying the reference oscillations to the first oscillator for the purpose of frequency modulating said very high frequency oscillations, a crystal detector, a resonant cavity through which part of the frequency modulated oscillations generated by the first oscillator is fed to the crystal detector, an amplifier which is tuned to pass components of an applied signal having frequencies equal to both the reference frequency and a side-band frequency twice said reference frequency, a path for feeding to the said amplifier the electric signal supplied by the crystal detector, means to control the gain of the amplifier in dependence upon the amplitude of the signal passed thereby, whereby in the absence of the reference frequency modulated component the gain of the amplifier is controlled by the side-band frequency component in order to maintain the gain of the amplifier substantially constant, a phase-sensitive device to compare the component of the signal passed by the said amplifier that has the reference frequency with the reference frequency oscillations generated by the second oscillator, and means to vary the mean operating frequency of the first oscillator in dependence upon the signal supplied by the phase detector so that the mean frequency of the very high frequency oscillations is substantially equal to the resonant frequency of the cavity.

8. An oscillation generator comprising a first oscillator for generating oscillations of very high frequency and which is adapted to be frequency modulated, a second oscillator to generate oscillations of a lower reference frequency, a path for supplying the reference oscillations to the first oscillator for the purpose of frequency modulating said very high frequency oscillations, a resonant cavity having a location physically remote from said oscillator, a cable coupling said first oscillator to said resonant cavity, a crystal detector, a path for supplying the frequency modulated oscillation passed by the resonant cavity to the crystal detector, an amplifier which is tuned to pass components of an applied signal having frequencies equal to both the reference frequency and a side-band frequency twice said reference frequency, a path for feeding to the said amplifier the electric signal supplied by the crystal detector, means to control the gain of the amplifier in dependence upon the amplitude of the signal passed thereby, whereby in the absence of the reference frequency modulated component the gain of the amplifier is controlled by the side-band frequency component in order to maintain the gain of the amplifier substantially constant, a phase-sensitive device to compare the component of the signal passed by the said amplifier that has the reference frequency with the reference frequency oscillations generated by the second oscillator, and means to vary the mean operating frequency of the first oscillator in dependence upon the signal supplied by the phase detector so that the mean frequency of the very high frequency oscillations is substantially equal to the resonant frequency of the cavity.

References Cited in the file of this patent

UNITED STATES PATENTS

| | | |
|---|---|---|
| 2,404,568 | Dow | July 23, 1946 |
| 2,447,098 | Silverman | Aug. 17, 1948 |
| 2,462,294 | Thompson | Feb. 22, 1949 |

| | | |
|---|---|---|
| 2,564,005 | Halpern et al. | Aug. 14, 1951 |
| 2,566,606 | Farnham | Sept. 4, 1951 |
| 2,605,425 | Hugenholtz | July 29, 1952 |
| 2,611,092 | Smullin | Sept. 16, 1952 |
| 2,691,103 | Zelst | Oct. 5, 1952 |

OTHER REFERENCES

Frequency Stabilization of Microwave Oscillators, by R. V. Pound in the Proceedings of the I. R. E., December 1947, pages 1405–1415.